(12) United States Patent
Iida et al.

(10) Patent No.: US 6,465,858 B2
(45) Date of Patent: Oct. 15, 2002

(54) SEMICONDUCTOR DEVICE PACKAGE FOR OPTICAL COMMUNICATION DEVICE

(75) Inventors: Masanori Iida, Katano (JP); Hiroyuki Asakura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/811,514

(22) Filed: Mar. 20, 2001

(65) Prior Publication Data

US 2001/0023970 A1 Sep. 27, 2001

(30) Foreign Application Priority Data

Mar. 24, 2000 (JP) .......................................... 2000-084006

(51) Int. Cl.⁷ .......................................... H01L 31/0203
(52) U.S. Cl. ........................................ 257/433; 257/432
(58) Field of Search ................................ 257/432, 433, 257/737

(56) References Cited

U.S. PATENT DOCUMENTS

| | | | | | |
|---|---|---|---|---|---|
| 5,834,843 | A | * | 11/1998 | Mori et al. | 257/723 |
| 6,242,778 | B1 | * | 6/2001 | Marmillion et al. | 257/347 |
| 6,285,079 | B1 | * | 9/2001 | Kunikiyo | 257/737 |
| 6,351,576 | B1 | * | 2/2002 | Ding | 385/14 |

* cited by examiner

*Primary Examiner*—Richard Elms
*Assistant Examiner*—Brad Smith
(74) *Attorney, Agent, or Firm*—Smith, Gambrell & Russell, LLP

(57) ABSTRACT

A semiconductor device package having a heat radiating base that has a depression. A circuit substrate is disposed on the heat radiating base to cover at least the depression. At least two semiconductor devices are mounted on both sides of the circuit substrates. The semiconductor device mounted on one major surface of the circuit substrate is coupled to the heat radiating base and is disposed in the depression.

19 Claims, 7 Drawing Sheets

SEMICONDUCTOR DEVICE PACKAGE FOR OPTICAL COMMUNICATION DEVICE

BACKGROUND OF THE INVENTION

1. Field of the Invention

The present invention relates to a semiconductor device package used in an optical transmitter-receiver circuit, mounting photo semiconductor devices or semiconductor devices on a circuit substrate.

2. Related Art of the Invention

When the application of optical fiber communications to CATV systems or mobile communications is considered, the optical transmitter-receiver is required to have properties to transmit analog signals with a broad area at a high speed. A system including photo semiconductor devices to be connected to optical fibers, and semiconductor devices for inputting/outputting of high frequency electrical signals in and from the photo semiconduct or devices, is used for optical communications.

FIG. 5 shows a conventional photo semiconductor and semiconductor device package. Here, an optical receiver will be described. Light from an optical fiber 100 enters into a photo diode (PD) 200, which is a photo semiconductor device having a light receiving function, from the obliquely ground and polished end. Signals photo-electrically converted by the PD 200 are inputted in a semiconductor device 300, which has a pre-amplifying function to amplify signals with low noise, and are amplified. The signals are then guided to a next-stage semiconductor device 400 for processing.

The photo semiconductor device (PD) 200, the semiconductor devices 300 and 400, and peripheral parts 122 and 132 are mounted on the same surface of a high-frequency circuit substrate 80, which is disposed and fixed on a housing base 70. Here, the photo semiconductor device 100 and the semiconductor devices 200 and 300 are mounted by flip chip bonding (FCB) using under fills 1000.

In the above-described structure, the distances between photo semiconductor devices and semiconductor devices adjacent to each other must be, for example, 0.3 mm or more in order to prevent under fills from overlapping, or to secure spaces for mounting peripheral parts even if no under fills are used. On the other hand, however, it is preferable that the distance between the photo semiconductor device and the next stage semiconductor device is as small as possible.

Also, since semiconductor devices having amplifying functions generate heat, the semiconductor devices are provided with heat-radiating mechanisms for radiating heat efficiently. However, the above-described structure may become complicated because the heat-radiating mechanism is disposed on the upper surface of the semiconductor devices shown in the diagram.

Although not shown in the diagram, a method of the heat radiation of semiconductor devices is performed by forming a hole to accommodate the semiconductor devices on the high-frequency circuit substrate 80, disposing the semiconductor devices on the housing base 70 upside down, and electrically connecting to the high-frequency circuit substrate 80 using wire bonding. However, since this is different from the semiconductor device packaging method, new production facilities for packaging different from the method of packaging photo semiconductor devices must be introduced in the actual manufacturing process, resulting in raising the costs of semiconductor device packages.

SUMMARY OF THE INVENTION

The object of the present invention is to solve the above-described problems, and to provide a semiconductor device package that can mount photo semiconductor devices and semiconductor devices close to each other as much as possible, radiates the heat of the semiconductor devices effectively, and can reduce- the size; and an optical communication device using such a semiconductor device package.

The 1st invention of the present invention is a semiconductor device package, comprising:
- a heat radiating base that has a depression;
- a circuit substrate disposed on said heat radiating base so as to cover at least said depression; and
- at least two semiconductor devices at least one of which is mounted on each of one and the other major surfaces of said circuit substrate,
- wherein said semiconductor device mounted on one major surface of said circuit substrate coupled to said heat radiating base is disposed in said depression, and is coupled to at least a part of said depression with good thermal conductivity.

The 2nd invention of the present invention is the semiconductor device package according to 1st invention,
- wherein said semiconductor device comprises at least one photo semiconductor device, and
- said semiconductor device package further comprises an optical fiber or an optical wave-guide for inputting and outputting lights to and from said photo semiconductor device.

The 3rd invention of the present invention is the semiconductor device package according to 2nd invention,
- wherein said semiconductor devices are mounted on the other major surface of said circuit substrate that is not coupled to said heat radiating base, and is connected to said semiconductor devices disposed in said depression.

The 4th invention of the present invention is the semiconductor device package according to 2nd invention,
- wherein said semiconductor devices are mounted on the other major surface of said circuit substrate that is not coupled to said heat radiating base, and
- all of said semiconductor devices other than said photo semiconductor device are mounted in said depression.

The 5th invention of the present invention is the semiconductor device package according to 1st or 2nd inventions, wherein said semiconductor devices mounted on one major surface of said circuit substrate that is coupled to said heat radiating base is fixed to the surface of said depression with a heat-conductive resin.

The 6th invention of the present invention is the semiconductor device package according to 1st or 2nd inventions, wherein said semiconductor devices are electrically connected to said circuit substrate with an electrically conductive resin.

The 7th invention of the present invention is the semiconductor device package according to 1st or 2nd inventions, wherein the dielectric constant of a part of said circuit substrate is different from the dielectric constant of other parts.

The 8th invention of the present invention is the semiconductor device package according to 7th invention, wherein the dielectric constant of said part of said circuit substrate is larger than the dielectric constant of said circuit substrate.

The 9th invention of the present invention is the semiconductor device package according to 7th invention, wherein said circuit substrate has a lamination structure, and said lamination structure comprises layers of materials having dielectric constants different from that of adjacent layers.

The 10th invention of the present invention is the semiconductor device package according to 9th invention, wherein said circuit substrate has an independent electrode disposed on said other major surface, a part of the electrodes of said semiconductor device is mounted on said independent electrode, and said independent electrode and said material of a different dielectric constant form a capacitor inside said circuit substrate.

The 11th invention of the present invention is the semiconductor device package according to 10th invention, wherein said electrodes of said semiconductor device are power supply terminals or bias terminals to said semiconductor device.

The 12th invention of the present invention is the semiconductor device package according to 1st or 2nd inventions, wherein said circuit substrate has via holes across the both major surfaces thereof, and at least two semiconductor device's mounted on one and the other major surfaces of said circuit substrate are electrically connected through said via holes at the distance of the thickness of said circuit substrate.

The 13th invention of the present invention is the semiconductor device package according to 2nd invention, wherein said optical wave-guide or said optical fiber is disposed in said circuit substrate.

The 14th invention of the present invention is the semiconductor device package according to 2nd invention, wherein said heat radiating base is provided with a first guide groove or a marker for locating said optical fiber.

The 15th invention of the present invention is the semiconductor device package according to 2nd invention, wherein said circuit substrate is provided with a second guide groove for disposing said optical wave-guide or said optical fiber.

The 16th invention of the present invention is the semiconductor device package according to 1st or 2nd inventions, wherein said semiconductor devices mounted on said circuit substrate, or said semiconductor devices and said optical wave-guide or said optical fiber are molded in an insulating resin.

The 17th invention of the present invention is the semiconductor device package according to 1st invention, wherein said circuit substrate is connected and fixed to said heat radiating base with an electrically conductive resin.

The 18th invention of the present invention is the semiconductor device package according to 2nd or 13th inventions, wherein said optical wave-guide or said optical fiber has a reflecting structure to receive and reflect light obliquely against the wave-guide direction of said light, and is optically connected to said photo semiconductor device.

The 19th invention of the present invention is an optical communication device that can be used as an optical transmitter or an optical receiver, comprising:

the semiconductor device package according to any one of 1st to 18th inventions;

modulating means or demodulating means; and transmitting means or receiving means.

According to the present invention, as described above, since photo semiconductor devices are electrically connected to semiconductor devices in close vicinity to each other, heat generated from semiconductor devices can be radiated effectively with out degrading high frequency characteristics. However, the term "semiconductor device" used herein generally represents a light emitting,element or light receiving element consisting of a semiconductor such as a semiconductor laser, an LED, and a photo diode, and also includes a composite element containing light emitting and light receiving elements. Although a photo semiconductor device has the same shape as a semiconductor device, the site for inputting/outputting light is located at the electrode side of the semiconductor device, or the back or side thereof.

DESCRIPTION OF SYMBOLS

Figure 1:
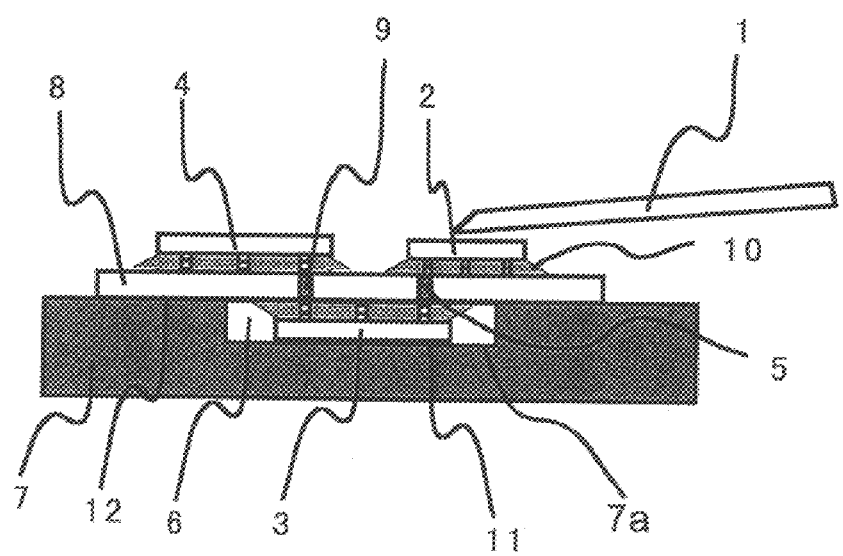
FIG. 1 is a schematic sectional view illustrating a semiconductor device package according to Embodiment 1 of the present invention.

1, 101 . . . Optical fiber
2 . . . Pin-PD
3, 4 . . . Semiconductor device
5, 9, 14, 16 . . . Via hole
8, 81 . . . Circuit substrate
7 . . . Heat radiating base
7a . . . Depression
102 . . . Optical wave-guide
120, 130 . . . Dielectric layer

PREFERRED EMBODIMENTS OF THE INVENTION

The embodiments of the present invention will be described below referring to the attached drawings. In the drawings, the same reference numerals or symbols represent the same or equivalent components,

Embodiment 1

FIG. 1 shows a semiconductor device package according to Embodiment 1 of the present invention. Here, a photo semiconductor device is a light receiving element such as a pin photo diode (hereafter abbreviated as "pin-PD") 2, and light enters into the pin-PD 2 from the obliquely ground and polished end of an optical fiber 1. The pin-PD 2 is electrically connected to a circuit substrate 8 with solder or a electrically conductive resin, and fixed to the circuit substrate 8 with an under fill 10.

A next-stage pre-amplifier IC 3 is mounted on the opposite side of the surface where the pin-PD 2 is mounted, and fixed to the circuit substrate 8 with an under fill 10. The signal line of the pre-amplifier IC 3 is electrically connected to the pin-PD 2 through a via hole 5 formed in the circuit substrate 8. The pre-amplifier IC 3 is also electrically connected to a next-stage semiconductor IC 4 through a via hole 9 in the circuit substrate 8. In particular, the pre-amplifier IC 3 is disposed in a gap 6 formed by the depression 7a formed in the heat radiating base 7 to which the circuit substrate 8 is fixed, and a part of the circuit substrate 8 exposed in the depression 7a, and the heat-radiating surface 11 of the pre-amplifier IC 3 is thermally connected to the heat-radiating base 7, which is also used for electrical grounding, through the depression 7a.

Here, as the first condition for the semiconductor devices and the photo semiconductor device to operate properly, since the characteristics of semiconductor devices, such as the pre-amplifier IC 3, change when affected by light depending on the composition, e.g. gallium arsenide, it is preferable to dispose such semiconductor devices apart from the photo semiconductor device. Also, since a photo semiconductor device, such as the pin-PD 2, is easily affected by heat, it is preferable to dispose such a photo semiconductor device apart from a semiconductor device likely to be a heat source, such as the pre-amplifier IC 3.

On the other hand, as the second condition, it is preferable to shorten the connecting line by disposing the pin-PD 2 in the close vicinity of the pre-amplifier IC 3 on the stand of view of improving high-frequency characteristics in the high-frequency band area in which the semiconductor device is operated (e.g. 1 GHz or higher, preferably 5 GHz or higher).

In the conventional example in which a photo semiconductor device and semiconductor devices are disposed on the same surface of the same circuit substrate, if one of the above-described two conditions is satisfied, the other is not satisfied. In this embodiment, however, the pre-amplifier IC 3 is electrically connected to the pin-PD 2 through the via hole 9 across the circuit substrate 8, and is disposed apart from the pin-PD 2 by the intervening circuit substrate 8.

Therefore, light in the vicinity of the pin-PD 2, which adversely affects the pre-amplifier IC 3, and heat from the pre-amplifier IC 3, which adversely affects the pin-PD 2, are shielded respectively by the circuit substrate 8, while since the pin-PD 2 and the pre-amplifier IC 3 are disposed in close vicinity from each other by connecting through the via hole 9, the connecting line can be shortened, and high-frequency characteristics can be improved. Also, since a part of the depression 7a formed in the heat-radiating base 7 is thermally connected to the pre-amplifier IC 3, the heat radiating characteristics of the pre-amplifier IC 3 can be improved.

According to the semiconductor device package of this embodiment having the above-described structure, the photo semiconductor device and semiconductor devices can be disposed in close vicinity using the unified packaging process that uses the conventional method of packaging the photo semiconductor device, the effect of light on the semiconductor devices disposed in close vicinity, and the effect of heat on the photo semiconductor device can be eliminated, and heat from the semiconductor devices can be radiated efficiently.

Figure 7:
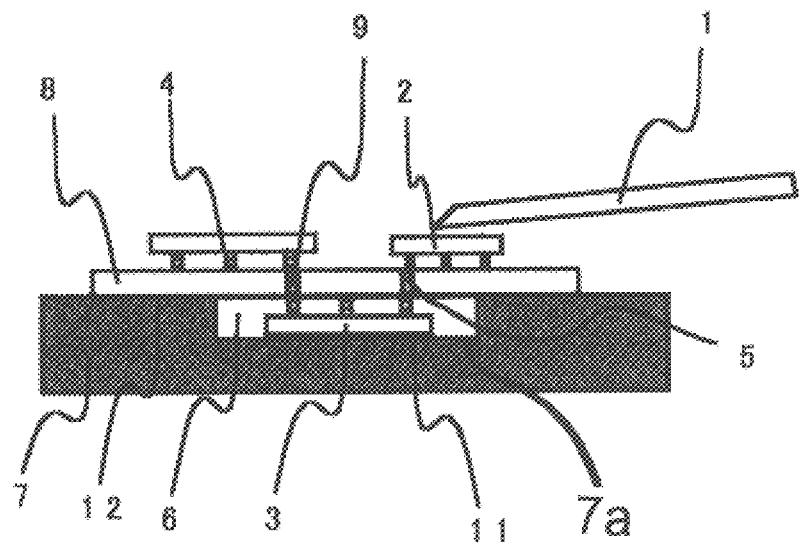
FIG. 7 is a schematic sectional view illustrating another exemplified structure of a semiconductor device package according to Embodiment 1 of the present invention.

Although the above structure is described that under fills 10 are filled between the circuit substrate 8 and the pin-PD 2, the semiconductor IC 4 and the pre-amplifier IC 3 disposed in the depression 7a, whereby the both are fixed, the under fills 10 may be omitted, and the semiconductor IC 4 and the pre-amplifier IC 3 disposed in the depression 7a may be fixed to the circuit substrate 8 using only the members for electrical connection, as FIG. 7 shows. In this case, the effect of the dielectric constant of the under fills 10 can be eliminated to further improve the high-frequency characteristics of the semiconductor devices. Here, it is preferable that the under fills 10 have fine heat conductivity, and silicone-base gel or heat-conductive resin may be used to make them.

Figure 8:
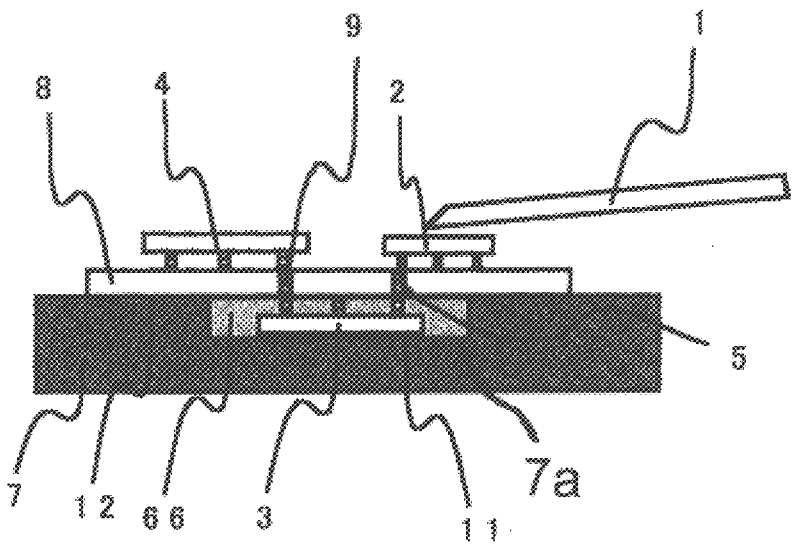
FIG. 8 is a schematic sectional view illustrating another exemplified structure of a semiconductor device package according to Embodiment 1 of the present invention.

Also, as FIG. 8 shows, if the gap 6 is filled with the under fill 10 so as to fix the pre-amplifier IC 3 in the depression 7a, the heat-radiation characteristics of the pre-amplifier IC 3 can further be improved.

Also in the above description, although the pre-amplifier IC 3 is thermally connected to the heat-radiating base 7 at the bottom of the depression 7a, it may be connected at the side of the depression 7a. To summarize, it is enough if the semiconductor devices of the present invention are disposed in the depression at least at a part thereof with a good thermal conductivity, and the part at which the semiconductor devices can be disposed may be at any portion of the depression.

Embodiment 2

Figure 2:
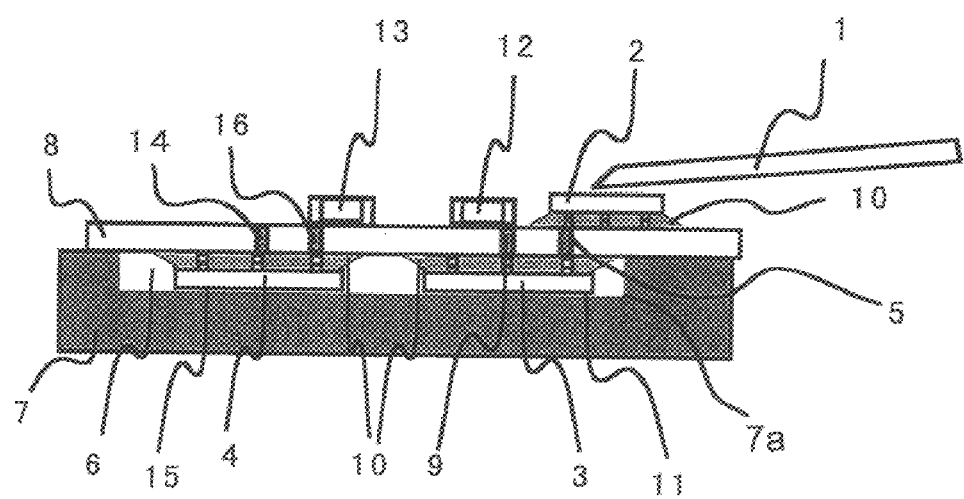
FIG. 2 is a schematic sectional view illustrating a semiconductor device package according to Embodiment 2 of the present invention.

FIG. 2 shows a semiconductor device package according to Embodiment 2 of the present invention. The difference from Embodiment 1 is that the semiconductor IC 4 is mounted on the same surface of the circuit substrate 8 on which the pre-amplifier IC 3 is mounted, and that the inputting/outputting of signals are performed on this substrate surface, and peripheral component parts 12 and 13 to be mounted in the periphery of ICs, such as capacitors, are mounted on the opposite surface where the pin-PD 2 is mounted, and are connected to the semiconductor IC 4 and the pre-amplifier IC 3 through via holes 9 and 16, respectively.

The output signals from the semiconductor IC 4 can be led to the surface of the circuit substrate 8 through, for example, the via hole 14, and can be taken out. This is the structure in which the heat-radiating surface 11 of the pre-amplifier IC 3 and heat-radiating surface 15 of the semiconductor IC 4 are thermally connected to the heat-radiating base 7, and this structure is effective in the case where the semiconductor IC 4 is a heat-generating IC, such as a post-amplifier and a signal processing IC. Furthermore, as is Embodiment 1, even if the semiconductor IC 4 is easily affected by light, such as gallium arsenide, the effect of light in the vicinity of the pin-PD 2 can be eliminated.

When the circuit substrate 8 is a substrate of a thickness of 1 mm or less, for example, an alumina ceramic substrate of a thickness of 0.3 mm, the pin-PD 2 can be connected to the pre-amplifier IC 3 with a signal line as short as at least 500 $\mu$m or less even if the thickness of the electrodes of the device is taken into consideration.

In order to mount the pin-PD 2 (photo semiconductor device) on the circuit substrate 8, and the pre-amplifier IC 3 and the semiconductor IC 4 (semiconductor devices), any connection methods using solder or an electrically conductive resin may be used. The device mounting using an electrically conductive resin can relieve stress due to difference of coefficients of thermal expansion between the devices and the circuit substrate.

According to the semiconductor device package of this embodiment, as described above, the efficiency of mounting devices on a circuit substrate can be improved, and heat from semiconductor devices can be radiated effectively, resulting in the downsizing of devices by mounting a photo semiconductor device and semiconductor devices, such as a pre-amplifier IC, on the both sides of the circuit substrate, electrically connecting the devices with signal lines between the both sides of the substrate, and thermally connecting heat-generating semiconductor devices to the heat-radiating housing. Furthermore, semiconductor devices easily affected by light can be shielded completely.

Moreover, by mounting the semiconductor devices on the surface opposite to the surface on which the component parts to be disposed in the periphery of the semiconductor devices are mounted, the peripheral parts can be mounted closer than the case where they are mounted on the same surface. This is particularly effective when the semiconductor devices are of a high-speed response type, and when capacitors for decoupling high frequency of the power source side.

Embodiment 3

Figure 3:
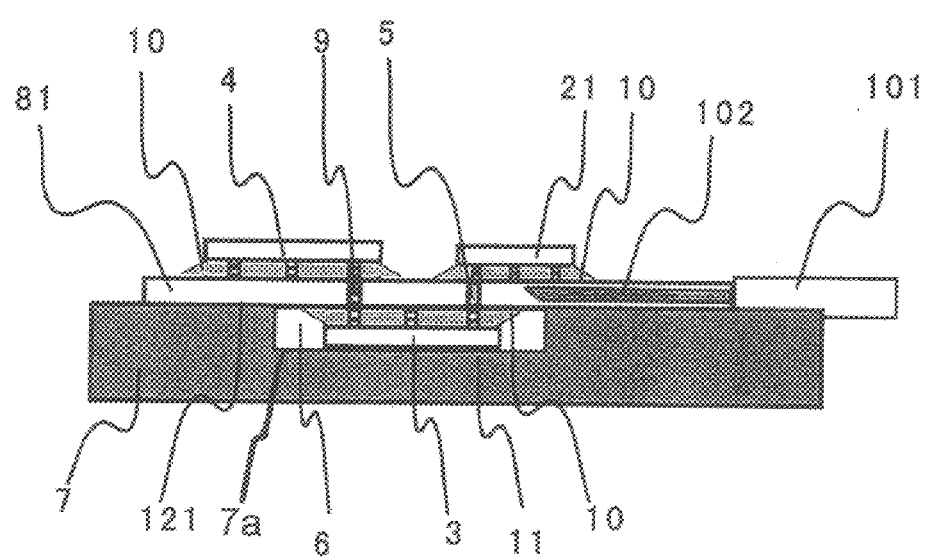
FIG. 3 is a schematic sectional view illustrating a semiconductor device package according to Embodiment 3 of the present invention.

FIG. 3 shows a semiconductor device package according to Embodiment 3 of the present invention. The difference from Embodiment 1 shown in FIG. 1 is that an optical wave guide 102 is formed in the circuit substrate 81, that an optical fiber 101 optically connected to the optical wave guide 102 is used, and that the light-receiving surface of the pin-PD 21 is provided to face the inside of the mounting surface of the substrate, that is the heat-radiating base 7.

In this case, the under fill 10 formed underneath the pin-PD 21 must be a transparent resin, such as silicone-based gel. Alternatively, the under fill 10 may be omitted from the structure. In FIG. 3, the optical wave guide 102 has a totally reflecting function at the location of the light-receiving surface of the pin-PD 21, reflects light upward seen in the diagram, and leads the light to the light-receiving surface of the pin-PD 21. The circuit substrate 81 may also be formed of a transparent material, such as a glass-based material. In this time, a guide groove, such as a V-groove or a U-groove, may be formed on the circuit substrate 81, and the optical wave guide 102 may be disposed in the guide groove.

According to the semiconductor device package of this embodiment, as described above, by incorporating the optical coupling system to the photo semiconductor device in the circuit substrate, the optical alignment of the optical fiber with the pin-PD can be performed using the alignment marker, resulting in the reduction of time for the device manufacturing process.

If a guide groove, such as a V-groove or a U-groove is formed on the heat-radiating base 7 when the optical fiber 101 is fixed to the heat-radiating base 7, the groove can be used as a marker to fix the circuit substrate 81 having the optical wave guide 102 to the heat-radiating base 7 as well as a groove for fixing the optical fiber, facilitating adjustment and fixing.

In the above description, the guide groove formed on the heat-radiating base 7 corresponds to the first guide groove of the present invention, and the guide groove formed on the circuit substrate 81 corresponds to the second guide groove of the present invention.

Embodiment 4

Figure 4:
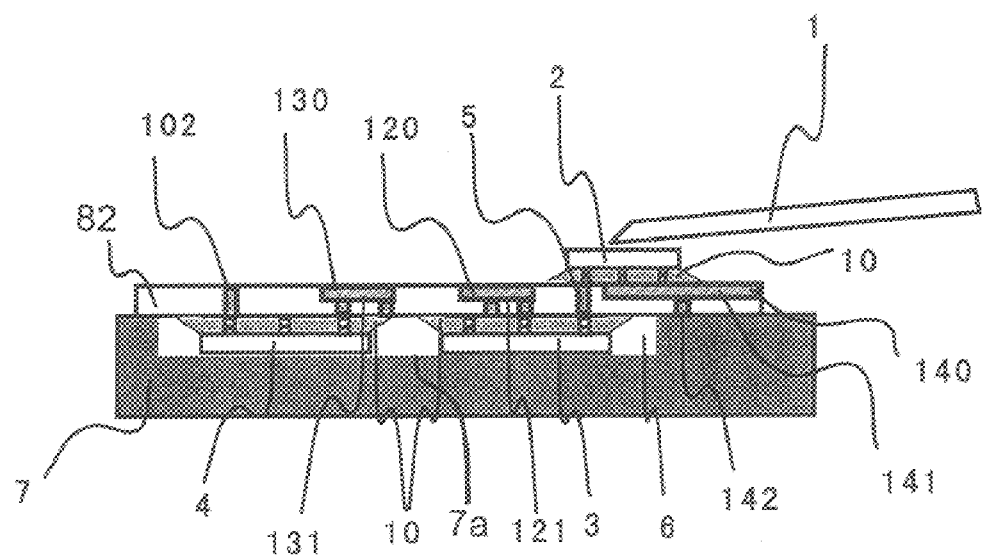
FIG. 4 is a schematic sectional view illustrating a semiconductor device package according to Embodiment 4 of the present invention.
Figure 5:
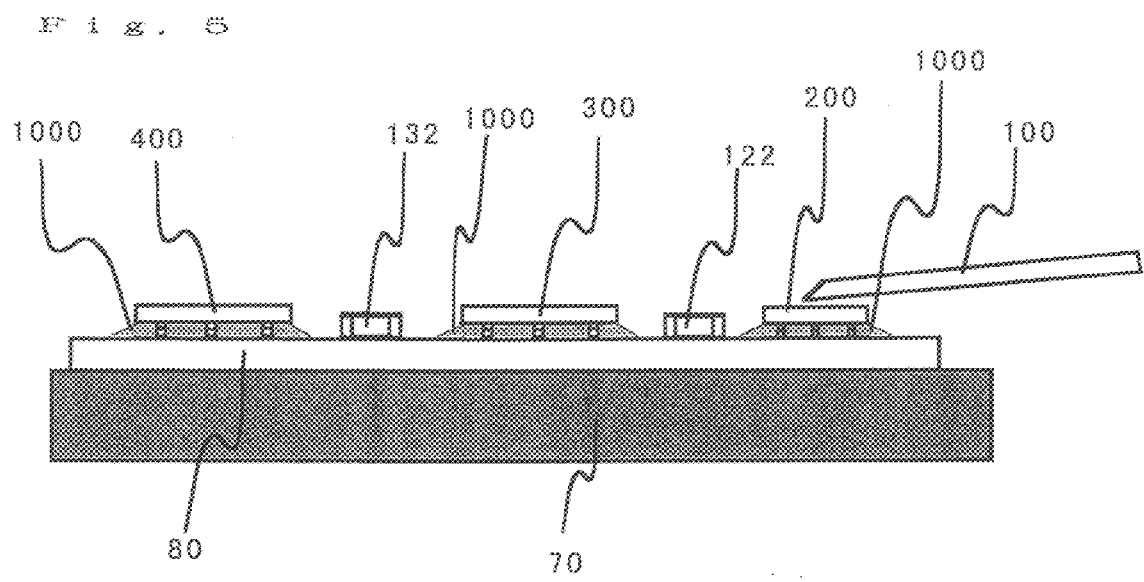
FIG. 5 is a schematic sectional view illustrating a conventional semiconductor device package.

FIG. 4 shows a semiconductor device package according to Embodiment 4 of the present invention. The difference from Embodiment 2 shown in FIG. 2 is that the embodiment has regions 120 and 130 formed by burying a material having a higher specific inductive capacity than the material of the circuit substrate 82 so as to expose on the surface of the circuit substrate 8 in the circuit substrate 82, and the region 141 formed of the same material on the mounting surface of the pin-PD 2, in place of disposing peripheral component parts 12 and 13 on the circuit substrate, and the surface in the lengthwise direction facing to these regions 120, 130, and 141 is sandwiched by conductive electrodes, so as to make the regions and electrodes function as a capacitor.

Since this capacitor is electrically connected to the power (bias) supply terminals of the pin-PD 2, the pre-amplifier IC 3, and the semiconductor IC 4, and the other conductor of the capacitor is grounded, this embodiment is particularly effective for the decoupling of high-frequency regions. If the material of a high dielectric constant to be buried is alumina- or glass-based ceramic material having a specific inductive capacity of 100 or higher, the 0.1 mm thickness of the layer and the 1 mm square region (layer area) of the structure of FIG. 4 can be used as a capacitor having the capacity of several picofarads.

Also, if a material having a higher dielectric constant, for example, a material having a dielectric constant exceeding 1,000, the size of the buried region can be reduced when a capacitor having the same capacity and the same thickness is formed. Furthermore, since a capacitor having a larger capacity (1,000 pF or larger) can be formed, decoupling in low-frequency regions can be realized by a substrate-buried capacitor.

Figure 6:
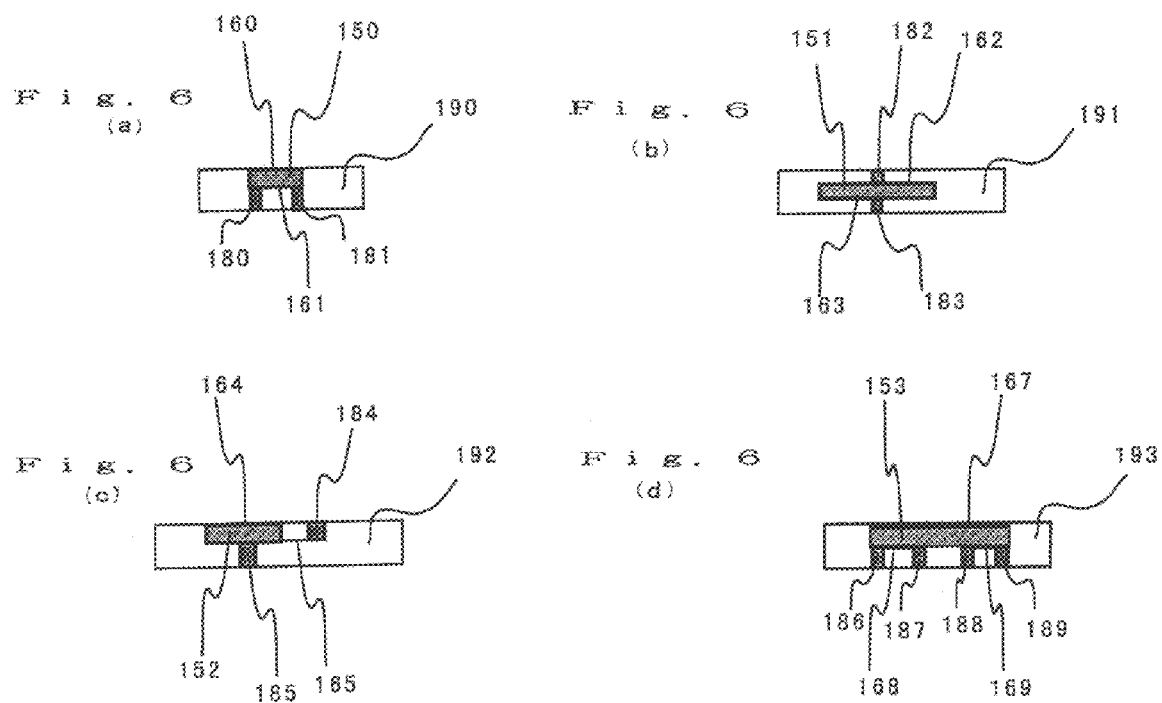
FIG. 6 is a schematic sectional view illustrating an exemplified structure of a substrate for a dielectric-layer buried circuit.

FIG. 6 shows several examples of the structures of electrode sandwiching the dielectric buried in the circuit substrate and the dielectric layer in this embodiment. In the structure shown in FIG. 6a, a dielectric layer 150 is buried in the surface layer of a circuit substrate 190, and electrodes 160 and 161 are formed so as to sandwich the dielectric layer 150. Via holes 180 and 181 are connected to the electrode 161 and the pattern on the back surface of the circuit substrate 190.

As also shown in FIG. 4, if one of the via holes is connected to the bias supplying pin of the semiconductor device 3, the other is connected to the bias supplying portion on the back surface of the circuit substrate 82, and the electrode 160 is connected to the ground on the upper surface of the circuit substrate, the dielectric layer 150 sandwiched by the electrodes 160 and 161 functions as a capacitor.

FIG. 6b shows another example of the structure of this embodiment, in which a dielectric layer 151 is formed as an inner layer of a circuit substrate 191. In this case, by connecting via holes 182 and 183 connected to electrodes 162 and 163, and to the pattern on the surface layer of the circuit substrate 191, the dielectric layer 151 functions as a capacitor. In this structure, since there is no dielectric layer on the surface layer of the circuit substrate 191, component parts and patterns can be formed and disposed in the vicinity of the via holes 182 and 183.

FIG. 6c shows a structure in which via holes to be connected to the electrode 161 in FIG. 6a are not formed on the same surface of the circuit substrate, and one of the electrodes of the capacitor is connected to the both surfaces of the circuit substrate with the electrode 165 extending from the dielectric layer 152 and via holes 184 and 185. Thereby, for example, the circuit of the bias supplying portion can be formed on the surface of the circuit substrate 192.

Next, FIG. 6d shows an example in which a plurality of electrodes 167 and 168, and 169 which are opposed each other are disposed on a part of a wide dielectric layer 153. Thereby, the dielectric layer sandwiched by electrodes 167 and 168 forms a capacitor, and the dielectric layer 153 sandwiched by electrodes 167 and 169 forms another capacitor. Of course, if further parallel electrodes are formed, a larger number of capacitors can be formed. In the example shown in FIG. 6d, the electrode 167 is used as a common electrode for the capacitor function, and if this portion is grounded, it can be used as a capacitor for decoupling. Of course, if the electrode 167 is separated for each location, it can be used as capacitors independent from each other. Since the capacity can be varied by the thickness of the dielectric layer or the size of the region, when used as the substrate for a high-frequency circuit, the size of the device can be reduced, the capacity of the transmitting line can be decreased, and the desired high-frequency characteristics can be secured even after packaging the device.

In each embodiment shown in FIGS. 1 to 4, 7, and 8, although a pin-PD, which is a light receiving element, is described as an example of the photo semiconductor device of the present invention, this maybe, for example, an avalanche photo diode (APD). Also, a semiconductor laser may be used as a photo semiconductor device. In order to apply to the example shown herein, the use of a surface emitting semiconductor laser having a small radiating angle is preferable. In this case, since the pre-amplifier IC2 becomes a laser driver IC generating more heat, this structure, which can radiate heat directly to the housing, is effective.

Also in the above-described embodiments, although the structures comprising semiconductor devices and a photo semiconductor device is described, the present invention may be a structure having only semiconductor devices. In this case, heat-radiating efficiency and packaging efficiency can be improved.

Also, in order to connect and fix the circuit substrate 8 to the heat-radiating base 7, fixing with metal screws or soldering can secure electrical connection.

Furthermore, if the application of stress to the connected and fixed portions due to difference in the coefficient of thermal expansion between the circuit substrate 8 and the heat-radiating base 7 is considered, the relaxation of the stress by connection using an electrically conductive adhesive may improve the connection stability.

Also, since an optical fiber and an optical wave guide, and a photo semiconductor device and semiconductor devices mounted on the circuit substrate 8 are mounted so as to well radiating heat, even if the structure is completely encapsulated by an insulating resin (not shown), there is no heat retention, mixing of dust or the like from the ambient can be prevented, and the stability of the operation for a long period of time can be secured.

Also, as the materials for the heat-radiating base 7, those which can secure sufficient grounding are preferable in order to improve high-frequency characteristics, and the materials that excel in both electrical conductivity and thermal conductivity, such as metals, are preferable. For example, copper or aluminum may be used.

Also, when a ceramic substrate is used as the material for circuit substrates 8, 81, and the like, Kovar (Fe—Ni—Co alloy) may be overlaid on the surface of the heat-radiating base 7 (surface contacting with the circuit substrates 8, 81, and the like), to absorb strain due to difference in the coefficient of thermal expansion, or the circuit substrate may be connected to the heat-radiating base 7 through a thin electrically conductive resin so as not to obstruct thermal conductivity between the circuit substrate and the heat-radiating base.

In addition, since the optical communication device constituted by the optical receiver or optical transmitter using the above-described semiconductor device package excels in the heat-radiating effect, and the heat-radiating base can be integrated with the housing, the heat-radiating area is practically increased, and has the effect of downsizing as an optical communication device operating as an optical transmitter when furnished with a modulator and a transmitter, and as an optical receiver when furnished with a demodulator and a receiver.

Since the present invention constituted as described above mounts semiconductor devices on the both surfaces of a circuit substrate, electrically connects signal lines between the surfaces of the substrate, and thermally connects heat-generating semiconductor devices to a heat-radiating housing, the efficiency of mounting devices on the circuit substrate can be improved, and heat can be radiated effectively, resulting in the downsizing of the device.

Furthermore, since the component parts to be disposed in the periphery of the semiconductor devices are mounted on the surface of the circuit substrate opposite to the surface on which the semiconductor devices are mounted, or the dielectric layer is formed on or buried in the circuit substrate, and connected to the electrodes, the efficiency of mounting devices on the circuit substrate having the same area can be improved, and the size of the device can further be reduced. This is particularly effective when the semiconductor devices are of a high-speed response type, and when capacitors for decoupling high frequency of the power source side.

What is claimed is:

1. A semiconductor device package, comprising:
 a heat radiating base that has a depression;
 a circuit substrate disposed on said heat radiating base so as to cover at least said depression, said circuit substrate having one major surface coupled to said heat radiating base, and another major surface; and
 at least two semiconductor devices at least one of which is mounted on said one and said other major surfaces of said circuit substrate, wherein
 said semiconductor device mounted on said one major surface of said circuit substrate is disposed in said depression, and is coupled to at least a part of said depression with good thermal conductivity.

2. A semiconductor device package, comprising:
 a heat radiating base that has a depression;
 a circuit substrate disposed on said heat radiating base so as to cover at least said depression, said circuit substrate having one major surface coupled to said heat radiating base, and an other major surface; and
 at least two semiconductor devices at least one of which is mounted on said one and said other major surfaces of said circuit substrate, wherein
 said semiconductor device mounted on said one major surface of said circuit substrate is disposed in said depression, and is coupled to at least a part of said depression with good thermal conductivity,
 said semiconductor device comprises at least one photo semiconductor device, and
 said semiconductor device package further comprises an optical fiber or an optical wave-guide for imputing and outputting lights to and from said photo semiconductor device.

3. The semiconductor device package according to claim 2,
wherein said semiconductor devices are mounted on the other major surface of said circuit substrate that is not coupled to said heat radiating base, and is connected to said semiconductor devices disposed in said depression.

4. The semiconductor device package according to claim 2, wherein said semiconductor devices are mounted on the other major surface of said circuit substrate that is not coupled to said heat radiating base, and
all of said semiconductor devices other than said photo semiconductor device are mounted in said depression.

5. The semiconductor device package according to claims 1 or 2, wherein said semiconductor device mounted on said one major surface of said circuit substrate that is coupled to said heat radiating base is fixed to the surface of said depression with a heat-conductive resin.

6. The semiconductor device package according to claims 1 or 2, wherein said semiconductor devices are electrically connected to said circuit substrate with an electrically conductive resin.

7. The semiconductor device package according to claims 1 or 2, wherein the dielectric constant of a part of said circuit substrate is different from the dielectric constant of another part thereof.

8. The semiconductor device package according to claim 7, wherein the dielectric constant of said part of said circuit substrate is larger than the dielectric constant of said circuit substrate.

9. The semiconductor device package according to claim 7, wherein said circuit substrate has a lamination structure, and
said lamination structure comprises layers of materials having dielectric constants different from that of adjacent layers.

10. The semiconductor device package according to claim 9, wherein said circuit substrate has an independent electrode disposed on said other major surface,
a part of the electrodes of said semiconductor device is mounted on said independent electrode, and said independent electrode and said material of a different dielectric constant form a capacitor inside said circuit substrate.

11. The semiconductor device package according to claim 10, wherein said electrodes of said semiconductor device are power supply terminals or bias terminals to said semiconductor device.

12. The semiconductor device package according to claims 1 or 2, wherein said circuit substrate has via holes across the both major surfaces thereof, and
at least two semiconductor devices mounted on one and the other major surfaces of said circuit substrate are electrically connected through said via holes at the distance of the thickness of said circuit substrate.

13. The semiconductor device package according to claim 2, wherein said optical wave-guide or said optical fiber is disposed in said circuit substrate.

14. The semiconductor device package according to claim 2, wherein said heat radiating base is provided with a first guide groove or a marker for locating said optical fiber.

15. The semiconductor device package according to claim 2, wherein said circuit substrate is provided with a second guide groove for disposing said optical wave-guide or said optical fiber.

16. The semiconductor device package according to claims 1 or 2, wherein said semiconductor devices mounted on said circuit substrate, or said semiconductor devices and said optical wave-guide or said optical fiber are molded in an insulating resin.

17. The semiconductor device package according to claim 1, wherein said circuit substrate is connected and fixed to said heat radiating base with an electrically conductive resin.

18. The semiconductor device package according to claims 2 or 13, wherein said optical wave-guide or said optical fiber has a reflecting structure to receive and reflect light obliquely against the wave-guide direction of said light, and is optically connected to said photo semiconductor device.

19. An optical communication device that can be used as an optical transmitter or an optical receiver, comprising:
the semiconductor device package according to claims 1 or 2;
modulating means or demodulating means; and
transmitting means or receiving means.

* * * * *